US010566196B2

(12) United States Patent
Kobayashi et al.

(10) Patent No.: US 10,566,196 B2
(45) Date of Patent: *Feb. 18, 2020

(54) METHOD FOR MANUFACTURING BONDED SOI WAFER

(71) Applicant: SHIN-ETSU HANDOTAI CO., LTD., Tokyo (JP)

(72) Inventors: Norihiro Kobayashi, Takasaki (JP); Osamu Ishikawa, Takasaki (JP); Kenji Meguro, Nagano (JP); Taishi Wakabayashi, Nagano (JP); Hiroyuki Oonishi, Ueda (JP)

(73) Assignee: SHIN-ETSU HANDOTAI CO., LTD., Tokyo (JP)

( * ) Notice: Subject to any disclaimer, the term of this patent is extended or adjusted under 35 U.S.C. 154(b) by 0 days.

This patent is subject to a terminal disclaimer.

(21) Appl. No.: 15/572,769

(22) PCT Filed: Mar. 14, 2016

(86) PCT No.: PCT/JP2016/001417
§ 371 (c)(1),
(2) Date: Nov. 8, 2017

(87) PCT Pub. No.: WO2016/199329
PCT Pub. Date: Dec. 15, 2016

(65) Prior Publication Data
US 2018/0122639 A1 May 3, 2018

(30) Foreign Application Priority Data
Jun. 9, 2015 (JP) .................. 2015-116675

(51) Int. Cl.
H01L 27/00 (2006.01)
H01L 21/20 (2006.01)
(Continued)

(52) U.S. Cl.
CPC .......... H01L 21/2007 (2013.01); H01L 21/02 (2013.01); H01L 21/3226 (2013.01); H01L 21/76254 (2013.01); H01L 27/12 (2013.01)

(58) Field of Classification Search
CPC . H01L 21/2007; H01L 21/02; H01L 21/3226; H01L 21/76254; H01L 27/12
See application file for complete search history.

(56) References Cited

U.S. PATENT DOCUMENTS 5,138,421 A * 8/1992 Saito ................... H01L 21/2007
257/52
5,863,659 A * 1/1999 Kobayashi ............ H01L 21/304
257/627
(Continued)

FOREIGN PATENT DOCUMENTS

EP 2 012 346 A1 1/2009
JP H03-132055 A 6/1991
(Continued)

OTHER PUBLICATIONS

Jun. 14, 2016 International Search Report issued in International Patent Application No. PCT/JP2016/001417.
(Continued)

Primary Examiner — Kimberly N Rizkallah
Assistant Examiner — Alexander Belousov
(74) Attorney, Agent, or Firm — Oliff PLC

(57) ABSTRACT

A method for manufacturing a bonded SOI wafer, including depositing a polycrystalline silicon layer on a base wafer, forming an insulator film on a bond wafer, bonding the bond wafer and a polished surface of the silicon layer with the insulator film interposed, and thinning the bond wafer, wherein a silicon single crystal wafer having a resistivity of 100 Ω·cm or more is the base wafer, the step of depositing the silicon layer includes a stage of forming an oxide film on the surface of the base wafer, and the silicon layer is
(Continued)

deposited between 1050° C. and 1200° C. Accordingly, the method enables a polycrystalline silicon layer to be deposited while preventing the progress of single crystallization even through a heat treatment step in the SOI wafer manufacturing process or a heat treatment step in the device manufacturing process and can improve throughput in the polycrystalline silicon layer depositing step.

5 Claims, 2 Drawing Sheets

(51) Int. Cl.
  *H01L 27/12* (2006.01)
  *H01L 21/02* (2006.01)
  *H01L 21/322* (2006.01)
  *H01L 21/762* (2006.01)

(56) References Cited

U.S. PATENT DOCUMENTS

| | | | |
|---|---|---|---|
| 7,667,283 B1* | 2/2010 | Smith | H01L 29/78603 257/432 |
| 2006/0166451 A1* | 7/2006 | Raskin | H01L 21/76254 438/311 |
| 2007/0032040 A1* | 2/2007 | Lederer | H01L 21/76254 438/455 |
| 2009/0104752 A1 | 4/2009 | Yoshida et al. | |
| 2012/0244687 A1* | 9/2012 | Kononchuk | H01L 21/02301 438/479 |
| 2012/0319121 A1* | 12/2012 | Reynaud | H01L 21/76254 257/66 |
| 2014/0038388 A1 | 2/2014 | Reynaud et al. | |
| 2014/0084290 A1* | 3/2014 | Allibert | H01L 21/76254 438/479 |
| 2015/0243550 A1* | 8/2015 | Aga | H01L 21/76254 438/458 |
| 2017/0033002 A1* | 2/2017 | Meguro | H01L 21/02 |

FOREIGN PATENT DOCUMENTS

| | | |
|---|---|---|
| JP | H05-226464 A | 9/1993 |
| JP | 2007-507093 A | 3/2007 |
| JP | 2007-507100 A | 3/2007 |
| JP | 2010-278160 A | 12/2010 |
| JP | 2012-164906 A | 8/2012 |
| JP | 2012-199550 A | 10/2012 |
| JP | 2013-513234 A | 4/2013 |
| JP | 2014-509087 A | 4/2014 |
| JP | 2015-060887 A | 3/2015 |
| JP | 2015-211074 A | 11/2015 |

OTHER PUBLICATIONS

Jan. 8, 2019 extended European Search Report issued in European Application No. 16807049.8.

Aug. 15, 2019 Office Action issued in Taiwanese Patent Application No. 105108251.

Aug. 29, 2019 Office Action issued in European Patent Application No. 16 807 049.8.

\* cited by examiner

METHOD FOR MANUFACTURING BONDED SOI WAFER

TECHNICAL FIELD

The present invention relates to a method for manufacturing a bonded SOI wafer.

BACKGROUND ART

An SOI wafer usable for RF (Radio Frequency) high frequency) devices has been achieved by increasing the resistivity of a base wafer. However, to meet further acceleration, it is required to deal with higher frequency, and the use of the conventional high-resistivity wafer alone is becoming unsatisfactory.

It is therefore suggested as measures to add a layer that has an effect of eliminating generated carriers (a carrier trapping layer) just under a buried oxide film layer (a BOX layer) of an SOI wafer, and it is becoming necessary to form a polycrystalline silicon layer having high resistivity on a base wafer to recombine carriers generated in the high-resistivity wafer.

Patent Document 1 describes forming a polycrystalline silicon layer or an amorphous silicon layer as the carrier trapping layer at an interface between a BOX layer and a base wafer.

On the other hand, Patent Document 2 also describes forming a polycrystalline silicon layer as the carrier trapping layer at an interface between a BOX layer and a base wafer; furthermore, heat treatment temperature after forming the polycrystalline silicon layer is restricted to prevent recrystallization of the polycrystalline silicon layer.

Moreover, Patent Document 3 does not describe forming a polycrystalline silicon layer or an amorphous silicon layer as the carrier trapping layer, but describes increasing the surface roughness of a base wafer surface on the side to be bonded to a bond wafer, thereby providing the same effect as the carrier trapping layer.

With regard to a method for producing a base wafer for manufacturing an SOT wafer usable for RF devices, Patent Document 4 describes forming a dielectric layer on a silicon substrate having a high resistivity more than 500 Ωcm, and forming a polycrystalline silicon layer on the dielectric layer while depositing it at 900° C. or less.

Patent Document 5 describes forming a dielectric material layer of thickness of 0.5 to 10 nm different, from a native oxide film on a silicon wafer having a high resistivity more than 500 Ωcm and then forming a polycrystalline silicon layer to manufacture an SOI wafer usable for RE1 devices.

CITATION LIST

Patent Literature

Patent Document 1: Japanese Unexamined Patent publication (Kohyou) No. 2007-507093
Patent Document 2: Japanese Unexamined Patent publication (Kohyou) No. 2013-513234
Patent Document 3: Japanese Unexamined Patent publication (Kokai) No. 2010-278160
Patent Document 4: Japanese Unexamined Patent publication (Kokai) No. 2012-199550
Patent Document. 5: Japanese Unexamined Patent publication (Kohyou) No. 2014-509087

SUMMARY OF INVENTION

Technical Problem

As mentioned above, forming a carrier trapping layer under a BOX layer of an SOI wafer is becoming necessary to manufacture a device that can deal with higher frequency.

However, when a usual polycrystalline silicon layer is deposited to form the carrier trapping layer, the polycrystalline silicon layer can be annealed and single-crystalized, reducing the effect as the carrier trapping layer, depending on thermal history during the SOI wafer manufacturing process or the device manufacturing process.

Therefore, it is necessary to prevent the progress of single crystallization even when a heat treatment is performed after depositing the polycrystalline silicon layer. In other words, it is necessary to deposit a polycrystalline silicon layer that has low cost and durable effect and is not single-crystalized even through a heat treatment step in the SOI wafer manufacturing process or a heat treatment step in the device manufacturing process.

However, all of Patent Documents 1 to 3 fail to disclose or suggest a technique for preventing the progress of single crystallization even when a heat treatment is performed after depositing the polycrystalline silicon layer.

On the other hand, Patent Documents 4 and 5 describe forming a dielectric layer between a polycrystalline silicon layer and a base wafer to inhibit single crystallization due to a heat treatment after depositing the polycrystalline silicon layer. However, regarding deposition temperature of the polycrystalline silicon layer, only Patent Documents 4 describes 900° C. or less. The reason why the polycrystalline silicon layer is formed at such a low temperature is that this temperature can prevent loss of the dielectric layer during deposition of the polycrystalline silicon layer and ensure inhibition of single crystallization of the polycrystalline silicon layer.

On the other hand, it is revealed that low deposition temperature of the polycrystalline silicon layer reduces throughput in the polycrystalline silicon layer depositing step due to insufficient deposition rate, thus increasing manufacturing cost.

The present invention was accomplished in view of the above-described problems. It is an object of the present invention to provide a method for manufacturing an SOI wafer that enables a polycrystalline silicon layer to be deposited while preventing the progress of single crystallization even through a heat treatment step in the SOI wafer manufacturing process or a heat treatment step in the device manufacturing process and can improve throughput in the polycrystalline silicon layer depositing; step.

Solution to Problem

To achieve this object, the present invention provides a method for manufacturing a bonded SOI wafer by bonding a bond wafer and a base wafer each composed of a silicon single crystal with an insulator film being interposed therebetween, the method comprising at least the steps of: depositing a polycrystalline silicon layer on a surface to be bonded of the base wafer; polishing a surface of the polycrystalline silicon layer; forming the insulator film on a surface to be bonded of the bond wafer; bonding the bond wafer and the polished surface of the polycrystalline silicon layer of the base wafer with the insulator film being interposed therebetween; thinning the bond wafer that has been bonded to form an SOI layer; wherein a silicon single crystal wafer having a resistivity of 100 G-cm or more is used as the base wafer, the step of depositing the polycrystalline silicon layer includes a stage of previously forming an oxide film having a thickness of 10 nm or more and 30 nm or less on the surface of the base wafer on which the polycrystalline silicon layer is to be deposited, and the polycrystalline silicon layer is deposited at 1050° C. or more and 1200° C. or less.

In this manner, when an oxide film having a thickness of 10 nm or more is previously formed between the surface of the silicon single crystal of the base wafer and the polycrystalline silicon layer to be deposited, the layer condition can be kept while preventing the oxide film from disappearing or becoming spherical spots during deposition of the polycrystalline silicon layer even if the polycrystalline silicon layer is formed at a high temperature of 1050° C. or more and 1200° C. or less. This enables inhibition of single crystallization due to a heat treatment step in the SOI wafer manufacturing process or a heat treatment in the device manufacturing process, during or after depositing the polycrystalline silicon layer. Moreover, the oxide film having a thickness of 30 nm or less can prevent the degradation of high-frequency characteristics due to an inversion layer easily formed on the front surface side of the base wafer.

Furthermore, when the deposition temperature of the polycrystalline silicon layer is 1050° C. or more, the deposition rate of the polycrystalline silicon layer can be sufficiently accelerated. This enables improvement in throughput and reduction in manufacturing cost even if the polycrystalline silicon layer is deposited with, for example, an atmospheric pressure epitaxy apparatus of a single-wafer-processing type. Moreover, when the deposition temperature is 1200° C. or less, occurrence of slip dislocation can be prevented.

After forming the oxide film and before depositing the polycrystalline silicon layer, a heat treatment is preferably performed at 1050° C. or more and 1200° C. or less for 1 second or more and 60 seconds or less under a hydrogen-containing atmosphere.

To an oxide film surface of the base wafer on which the oxide film has been formed are attached traces of impurities that serve as a dopant during or after forming the oxide film. The traces of impurities can diffuse into the base wafer through the oxide film, degrading high-frequency characteristics in some cases. Therefore, the heat treatment at 1050° C. or more and 1200° C. or less for 1 second or more and 60 seconds or less under a hydrogen-containing atmosphere before depositing the polycrystalline silicon layer can remove these impurities and thus prevent the impurities that serve as a dopant from diffusing into the base wafer, thereby surely preventing the degradation of high-frequency characteristics.

The heat treatment under the hydrogen-containing atmosphere and the depositing the polycrystalline silicon layer are preferably successively performed with one apparatus.

In this manner, when the heat treatment under the hydrogen-containing atmosphere and the deposition of the polycrystalline silicon layer are successively performed with one apparatus, throughput can be more effectively improved, and manufacturing cost can be more effectively reduced.

Advantageous Effects of Invention

As mentioned above, the method for manufacturing a bonded SOI wafer according to the present invention enables a polycrystalline silicon layer to be deposited while preventing the progress of single crystallization even through a heat treatment step in the SOI wafer manufacturing process or a heat treatment step in the device manufacturing process and can improve throughput in the polycrystalline silicon layer depositing step, thus reducing manufacturing cost.

DESCRIPTION OF EMBODIMENTS

As mentioned above, forming a carrier trapping layer under a BOX layer of an SOI wafer is becoming necessary to manufacture a device that can deal with higher frequency. However, when a usual polycrystalline silicon layer is deposited to form the carrier trapping layer, the polycrystalline silicon layer can be annealed and single-crystalized, reducing the effect as the carrier trapping layer, depending on thermal history during the SOI wafer manufacturing process or the device manufacturing process.

On the other hand, Patent Documents 4 and 5 describe forming a dielectric layer between a polycrystalline silicon layer and a base wafer to inhibit single crystallization due to a heat treatment after depositing the polycrystalline silicon layer. However, as mentioned above, it is revealed that these methods have problems in that low deposition temperature of the polycrystalline silicon layer reduces throughput in the polycrystalline silicon layer depositing step due to insufficient deposition rate, thus increasing manufacturing cost.

In view of this, the present inventors repeatedly and keenly conducted studies on a method for manufacturing a bonded SOI wafer that enables a polycrystalline silicon layer to be deposited while preventing the progress of single crystallization even through a heat treatment step in the SOI wafer manufacturing process or a heat treatment step in the device manufacturing process and can improve throughput in the polycrystalline silicon layer depositing step.

As a result, the present inventors found that when an oxide film having a thickness of 10 nm or more and 30 nm or less is previously formed on the surface of the base wafer on which the polycrystalline silicon layer is to be deposited, and the polycrystalline silicon layer is deposited at 1050° C. or more and 1200° C. or less, it is possible to deposit the polycrystalline silicon layer while preventing the progress of single crystallization even through a heat treatment step in the SOI wafer manufacturing process or a heat treatment step in the device manufacturing process and improve throughput in the polycrystalline silicon layer depositing step, thereby bringing the present invention to completion.

Hereinafter, embodiments of the present invention will be described in detail with reference to drawings, but the present invention is not limited thereto.

An embodiment of the present invention will be described with reference to FIGS. 1 and 2 below.

Figure 1:
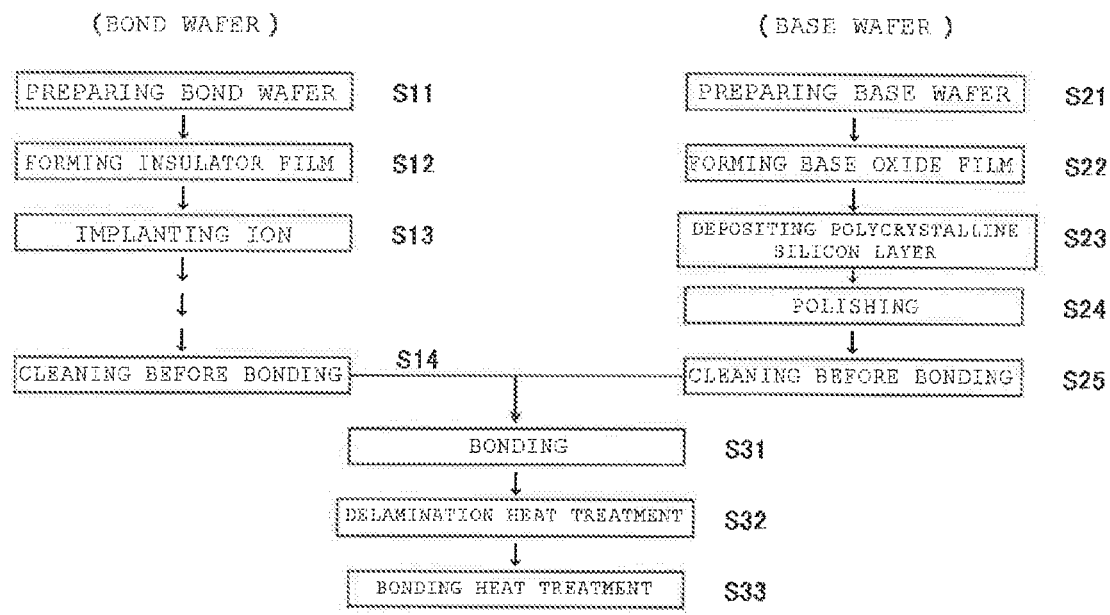
FIG. 1 is a flow chart showing an exemplary method for manufacturing a bonded SOI wafer according to an embodiment of the present invention.
Figure 2:
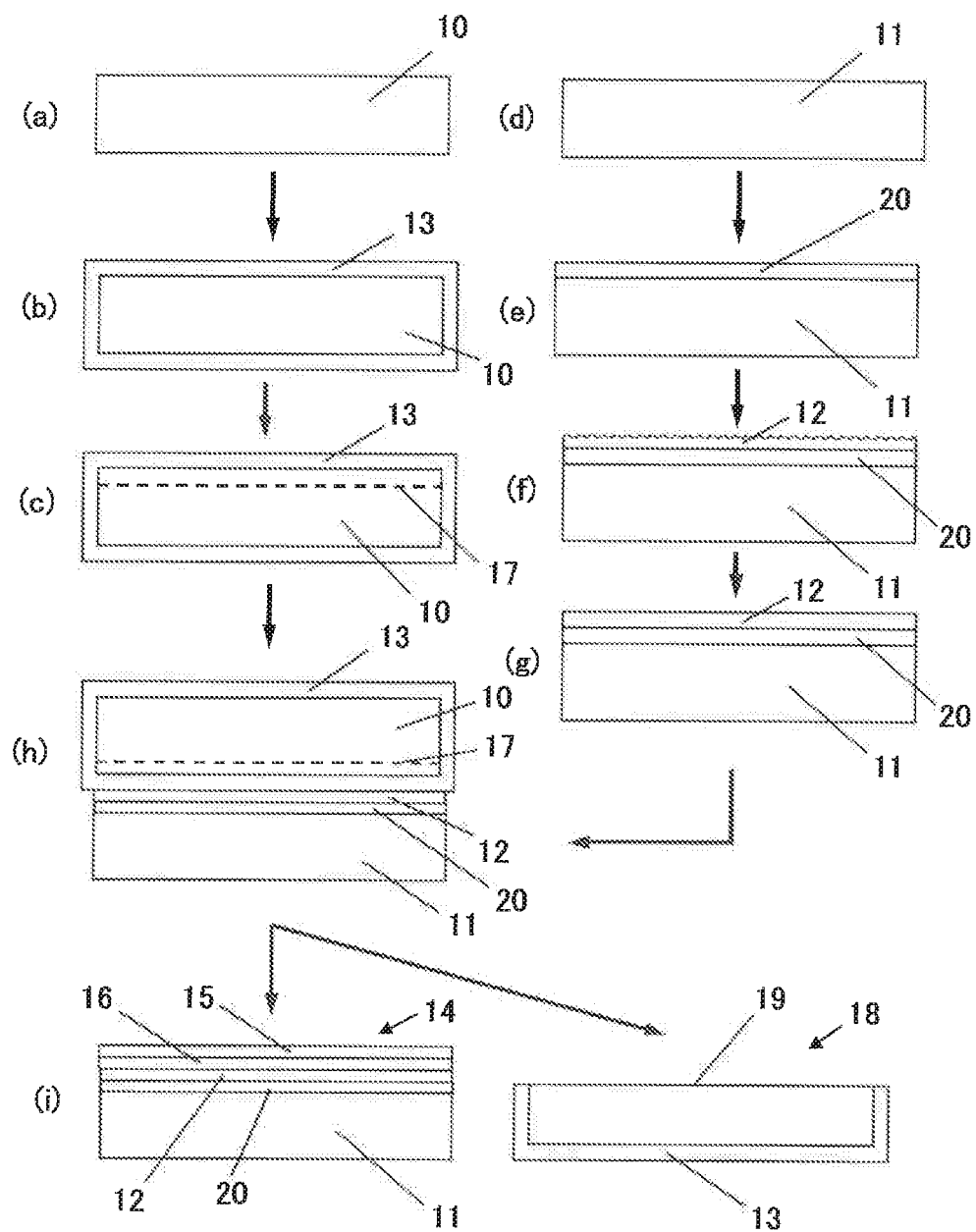
FIG. 2 is a cross-sectional view showing an exemplary method for manufacturing a bonded SOI wafer according to an embodiment of the present invention.

First, a bond wafer 10 composed of a silicon single crystal is prepared (See step S11 of FIG. 1 and FIG. 2(a)).

Then, an insulator film (e.g. an oxide film) 13 that will become a buried insulator film layer (also referred to as a BOX layer in case of a buried oxide film layer) (a buried insulator film layer 16 in FIG. 2(i) described later) is grown by, for example, thermal oxidation, CVD or the like (See step S12 of FIG. 1 and FIG. 2(b)).

Then, at least one gas ion selected from a hydrogen ion and a rare gas ion is implanted from the insulator film 13 with an ion implanting apparatus to form an ion implanted layer 17 in the bond wafer 10 (See step S13 of FIG. 1 and FIG. 2(c)). In this step, the ion implantation accelerating voltage is selected such that a resulting SOI layer (an SOI layer 15 in FIG. 2(i) described later) has an intended thickness.

Then, a surface to be bonded of the bond wafer 10 is cleaned before bonding to remove particles (See step S14 of FIG. 1).

In the meanwhile, separately, a base wafer 11 composed of a silicon single crystal is prepared (See step S21 of FIG. 1 and FIG. 2(d)).

Then, an oxide film (a base oxide film) 20 is formed on the base wafer 11 (See step S22 of FIG. 1 and FIG. 2(e)). The thickness of the formed oxide film 20 is 10 nm or more and 30 nm or less. The thickness is preferably thicker than 10 nm, for: example, 15 nm or more to surely prevent the oxide film from disappearing or becoming spherical spots during deposition of the polycrystalline silicon layer.

A method for forming; the oxide film with such thickness is not particularly limited; a uniform oxide film can be formed by a method of performing thermal oxidation at low temperature for short time in an oxidizing atmosphere with a usual neat treatment furnace of a batch type, or a method of performing thermal oxidation treatment (RTO) with a rapid heating and rapid cooling apparatus (an RTA apparatus).

Then, a polycrystalline silicon layer 12 is deposited on the oxide film (the base oxide film) 20 (See step S23 of FIG. 1 and FIG. 2(f)). In this step, the deposition temperature is 1050° C. or more and 1200° C. or less. As an atmosphere gas during temperature rising to the deposition temperature, 100% $H_2$ is generally used.

Since the deposition temperature is 1050° C. or more and 1200° C. or less, grain growth of the polycrystalline silicon layer can be inhibited, and the effect as the carrier trapping layer can be maintained even if a heat treatment step in the SOI wafer manufacturing process or a heat treatment in the device manufacturing process is performed at relatively high temperature (e.g. about 1000 to 1200° C.). Moreover, an effect of removing impurities attached to the surface of the oxide film 20 can be obtained by a hydrogen-containing atmosphere during temperature rising.

Moreover, since the deposition temperature is 1050° C. or more and 1200° C. or less, the polycrystalline silicon layer 12 can be deposited at high speed under atmospheric pressure by using trichlorosilane as a source gas with a usual CVD apparatus for epitaxial growth. To achieve higher speed deposition, the deposition temperature is preferably set at 1100° C. or more.

Just before depositing the polycrystalline silicon layer through temperature rising, a heat treatment is preferably performed at a certain temperature selected from temperature range of 1050° C. or more and 1200° C. or less, for a certain period of 1 second or more and 60 seconds or less under a hydrogen-containing atmosphere to slightly etch the surface of the oxide film and sufficiently remove impurities attached to the surface. This can prevent the diffusion of the impurities that serve as a dopant into the base wafer, thereby surely preventing the degradation of high-frequency characteristics.

Moreover, the heat treatment under the hydrogen-containing atmosphere is preferably performed with a CVD apparatus for depositing the polycrystalline silicon layer since when the heat treatment under the hydrogen-containing atmosphere and the depositing the polycrystalline silicon layer are successively performed with one apparatus, productivity can be improved. However, the heat treatment and the deposition may be performed as different steps with different apparatuses.

Then, the surface of the polycrystalline silicon layer 12 deposited on the base wafer 11 is flattened by polishing (See step S24 of FIG. 1 and FIG. 2(g)). The polycrystalline silicon layer 12 deposited at 1050° C. or more and 1200° C. or less has large surface roughness, and is difficult to be bonded to the bond wafer as it is. Thus, the surface of the polycrystalline silicon layer 12 requires flattening by polishing.

Then, cleaning is performed before bonding to remove particles on the surface of the polycrystalline silicon layer 12 polished (See step S25 of FIG. 1).

Steps S11 to S14 of FIG. 1 and steps S21 to S25 of FIG. 1 may be performed in parallel.

Then, the base wafer 11 on which the oxide film 20 and the polycrystalline silicon layer 12 have been formed is brought in close contact with and bonded to the bond wafer 10 on which the insulator film 13 has been formed such that the surface of the base wafer 11 on which the polycrystalline silicon layer 12 has been formed contacts the surface of the bond wafer 10 from which ions have been implanted (See step S31 of FIG. 1 and FIG. 2(h)).

Then, the wafers bonded are subjected to a heat treatment (a delamination heat treatment) to generate a micro bubble layer in the ion implanted layer 17, and are delaminated along the generated micro bubble layer to manufacture a bonded wafer 14 in which a buried insulator film layer 16 and an SOI layer 15 are formed on the base wafer 11 (See step S32 of FIG. 1 and FIG. 2(i)). In this step, a delaminated wafer 18 having a delamination surface 13 is derived.

Then, the bonded wafer 14 is subjected to a bonding heat treatment to increase the bonding strength of the bonding interface (See step S33 of FIG. 15.

As described above, the bonded SOI wafer can be manufactured.

In the above example, the bond wafer 10 is thinned by forming the ion implanted layer 17 and delaminating with the ion implanted layer 17, but it is not limited thereto. The thinning of the bond wafer 10 may be performed by, for example, a combination of grinding, polishing, etching, and the like.

In the inventive method for manufacturing a bonded SOI wafer, the oxide film having a thickness of 10 nm or more and 30 nm or less is previously formed between the surface of the silicon single crystal of the base wafer and the polycrystalline silicon layer to be deposited, which enables inhibition of single crystallization due to a heat treatment step in the SOI wafer manufacturing process or a heat treatment in the device manufacturing process after deposition. Furthermore, since the deposition temperature of the polycrystalline silicon layer is 1050° C. or more and 1200° C. or less, grain growth of the polycrystalline silicon layer can be inhibited, and the effect as the carrier trapping layer can be maintained even if a heat treatment step in the SOI wafer manufacturing process or a heat, treatment in the device manufacturing process is performed at relatively high temperature (e.g. about 1000 to 1200° C.), as well as the deposition rate of the polycrystalline silicon layer can be sufficiently accelerated, and thus improvement in throughput and reduction in manufacturing cost can be achieved even if the polycrystalline silicon layer is deposited with, for example, an atmospheric pressure epitaxy apparatus of a single-wafer-processing type.

In addition, when the resistivity of the base wafer 11 is 100 Ω·cm or more, the wafer can be suitably used for manufacturing high-frequency devices; the resistivity is preferably 1000 Ω·cm or more, particularly preferably 3000 Ω·cm or more. The upper limit of the resistivity is not particularly limited, and for example, can be 50000 Ω·cm.

EXAMPLE

Hereinafter, the present invention will be more specifically described with reference to Examples and Comparative Examples, but the present invention is not limited thereto.

Example 1

A bonded SOI wafer was manufactured by the manufacturing method described with reference to FIGS. 1 and 2. However, a p-type single crystal silicon having a diameter of 300 mm, a crystal orientation of <100>, and a resistivity of 1300 Ω·cm was used as the base wafer; and the base oxide film formation and the polycrystalline silicon layer deposition (using trichlorosilane as a source gas) in the base wafer, the BOX oxidation and the hydrogen ion implantation in the bond wafer, and the delamination heat treatment and the bonding heat treatment after bonding were performed under the following conditions.
Base Oxide Film Formation:
  RTO (Oxidation heat treatment with an RTA apparatus)
  Oxide film thickness 30 nm
Hydrogen Heat Treatment Before Depositing Polycrystalline Silicon Layer:
  None (However, the atmosphere during temperature rising to the deposition temperature was 100% $H_2$)
Polycrystalline Silicon Layer Deposition:
  1100° C., Atmospheric pressure, Film thickness 3.0 μm, (2.5 μm after polishing)
BOX Oxidation:
  1050° C., Oxide film thickness 400 nm
Hydrogen Ion Implantation: 105 keV, $7.5 \times 10^{16}/cm^2$
Delamination Heat Treatment:
  500° C., 30 minutes, 100% Ar atmosphere
Bonding Heat Treatment:
  900° C., Pyrogenic oxidation+1100° C., 120 minutes, Ar annealing The state of single crystallization of the polycrystalline silicon layer after the bonding heat treatment was examined by cross-sectional SEM observation, Moreover, the resistivity on the base wafer surface (in the vicinity of the interface between the base oxide film and the base wafer) after the bonding heat, treatment was measured by SR (Spreading Resistance) method. The results are shown in Table 1.

Example 2

A bonded SOI wafer was manufactured as in Example 1 except that the polycrystalline silicon layer deposition was performed at 1130° C., and just before deposition, a heat treatment (1130° C., 20 seconds) was performed under a hydrogen-containing atmosphere in the same apparatus.
The state of single crystallization of the polycrystalline silicon layer and the resistivity of the base wafer surface were examined as in Example 1. The results are shown, in Table 1.

Example 3

A bonded SOI wafer was manufactured as in Example 1 except that the ETO treatment time was adjusted such that the base oxide film had a thickness of 15 nm, the polycrystalline silicon layer deposition was performed at 1150° C., and just before deposition, a hydrogen heat treatment (1130° C., 20 seconds) was performed in the same apparatus.

The state of single crystallization of the polycrystalline silicon layer and the resistivity of the base wafer surface were examined as in Example 1. The results are shown in Table 1.

Example 4

A bonded SOI wafer was manufactured as in Example 1 except that the RTG treatment time was adjusted such that the base oxide film had a thickness of 10 nm, the polycrystalline silicon layer deposition was performed at 1200° C., and just before deposition, a hydrogen heat treatment (1130° C., 20 seconds) was performed in the same apparatus.

The state of single crystallization of the polycrystalline silicon layer and the resistivity of the base wafer surface were examined as in Example 1. The results are shown in Table 1.

Example 5

A bonded SOI wafer was manufactured as in Example 1 except that the RTO treatment time was adjusted such that the base oxide film had a thickness of 15 nm, and the polycrystalline silicon layer deposition was performed at 1050° C.

The state of single crystallization of the polycrystalline silicon layer and the resistivity of the base wafer surface were examined as in Example 1. The results are shown in Table 1.

Comparative Example 1

A bonded SOI wafer was manufactured as in Example 1 except that the polycrystalline silicon layer deposition was performed at 900° C.

The state of single crystallization of the polycrystalline silicon layer and the resistivity of the base wafer surface were examined as in Example 1. The results are shown in Table 1.

Comparative Example 2

A bonded SOI wafer was manufactured as in Example 4 except that the RTO treatment time was adjusted such that the base oxide film, had a thickness of 8 nm, and no hydrogen heat treatment, was performed before depositing the polycrystalline silicon layer.

The state of single crystallization of the polycrystalline silicon layer and the resistivity of the base wafer surface were examined as in Example 4. The results are shown in Table 1.

TABLE 1

|  |  | Example 1 | Example 2 | Example 3 | Example 4 | Example 5 | Comparative Example 1 | Comparative Example 2 |
|---|---|---|---|---|---|---|---|---|
| Base wafer | | 300 mm diameter, crystal orientation <100>, 1300 Ω·cm resistivity p-type | | | | | | |
| Base oxide film thickness | | 30 nm | 30 nm | 15 nm | 10 nm | 15 nm | 30 nm | 8 nm |
| Hydrogen heat treatment before polycrystalline silicon layer deposition (100% H2) | | No | 1130° C. 20 sec | 1130° C. 20 sec | 1130° C. 20 sec | No | No | No |
| Polycrystalline silicon layer deposition condition | Temperature | 1100° C. | 1130° C. | 1150° C. | 1200° C. | 1050° C. | 900° C. | 1200° C. |
| | Pressure | Atmospheric pressure | Atmospheric pressure | Atmospheric pressure | Atmospheric pressure | Atmospheric pressure | Atmospheric pressure | Atmospheric pressure |
| | Thickness (before polishing) | 3.0 μm | 3.0 μm | 3.0 μm | 3.0 μm | 3.0 μm | 3.0 μm | 3.0 μm |
| | Deposition rate | 3.2 μm/min | 3.5 μm/min | 3.6 μm/min | 4.0 μm/min | 2.9 μm/min | 0.5 μm/min | 4.0 μm/min |
| | Thickness (after polishing) | 2.5 μm | 2.5 μm | 2.5 μm | 2.5 μm | 2.5 μm | 2.5 μm | 2.5 μm |
| State of single crystallization of polycrystalline silicon layer (when SOI wafer was completed) | | No problem | No problem | No problem | No problem | No problem | No problem | Single crystallization |
| Reduction in resistivity of base wafer surface (when SOI wafer was completed) | | No problem | No problem | No problem | No problem | No problem | No problem | Reduction |

As understood from Table 1, in Examples 1 to 5 where the base oxide film was 10 nm or more and 30 nm or less thick and the polycrystalline silicon layer was deposited at 1050° C. or more and 1200° C. or less, the polycrystalline silicon layer could be deposited at sufficiently high speed with a deposition rate of 2.9 μm/min or more, and no problems of single crystallization of the polycrystalline silicon layer and reduction in resistivity occurred.

In contrast, Comparative Example 1 where the deposition temperature of the polycrystalline silicon layer was 900° C. showed a deposition rate of 0.5 μm/min, which is low rate that is not more than about one sixth of those in Examples 1 to 5, and thus throughput was significantly reduced.

In addition, in Comparative Example 2 where the base oxide film was 8 nm thick, the base oxide film disappeared in the polycrystalline silicon deposition step, and single crystallization of the polycrystalline silicon layer was caused. Moreover, reduction in resistivity was observed on the base wafer surface due to the absence of the hydrogen heat treatment before depositing the polycrystalline silicon layer and the disappearance of the base oxide film. This is considered to be caused by diffusion of impurities that serve as a dopant into the base wafer.

Comparative Example 3

A bonded SOI wafer was manufactured as in Example 1 except that the RTO treatment time was adjusted such that the base oxide film had a thickness of 40 nm.

High-frequency integrated circuit devices were produced on the SOI layers of the bonded SOI wafers manufactured in Example 1 and Comparative Example 3. The second harmonic characteristics of the respective devices were measured and compared. As a result, it was revealed that Comparative Example 3 was inferior in second harmonic characteristics to Example 1. This is considered to be degradation of high-frequency characteristics caused, by forming an inversion layer clue to the base oxide film of 40 nm thick.

It is to be noted that the present invention is nor limited to the foregoing embodiment. The embodiment is just an exemplification, and any examples that have substantially the same feature and demonstrate the same functions and effects as those in the technical concept described in claims of the present invention are included in the technical scope of the present invention.

The invention claimed is:

1. A method for manufacturing a bonded SOI wafer by bonding a bond wafer and a base wafer each composed of a silicon single crystal with an insulator film being interposed therebetween, the method comprising at least the steps of:
    depositing a polycrystalline silicon layer on a surface to be bonded of the base wafer;
    polishing a surface of the polycrystalline silicon layer;
    forming the insulator film on a surface to be bonded of the bond wafer;
    bonding the bond wafer and the polished surface of the polycrystalline silicon layer of the base wafer with the insulator film being interposed therebetween;
    thinning the bond wafer that has been bonded to form an SOI layer; wherein
    a silicon single crystal wafer having a resistivity of 100 Ω·cm or more is used as the base wafer,
    the step of depositing the polycrystalline silicon layer includes a stage of previously forming an oxide film having a thickness thicker than 10 nm and less than or equal to 30 nm on the surface of the base wafer on which the polycrystalline silicon layer is to be deposited, and
    the polycrystalline silicon layer is deposited at 1050° C. or more and 1200° C. or less.

2. The method for manufacturing a bonded SOI wafer according to claim 1, wherein, after forming the oxide film and before depositing the polycrystalline silicon layer, a heat treatment is performed at 1050° C. or more and 1200° C. or less for 1 second or more and 60 seconds or less under a hydrogen-containing atmosphere.

3. The method for manufacturing a bonded SOI wafer according to claim 2, wherein the heat treatment under the hydrogen-containing atmosphere and the depositing the polycrystalline silicon layer are successively performed with one apparatus.

4. The method for manufacturing a bonded SOI wafer according to claim 1, wherein the thickness of the oxide film is 15 nm or more and less than or equal to 30 nm.

5. The method for manufacturing a bonded SOI wafer according to claim 1, wherein the polycrystalline silicon layer is deposited at 1100° C. or more and 1200° C. or less.

* * * * *